(12) United States Patent
Yelehanka et al.

(10) Patent No.: US 6,884,712 B2
(45) Date of Patent: Apr. 26, 2005

(54) METHOD OF MANUFACTURING SEMICONDUCTOR LOCAL INTERCONNECT AND CONTACT

(75) Inventors: Pradeep Yelehanka, Singapore (SG); Tong Qing Chen, Singapore (SG); Zhi Yong Han, Singapore (SG); Zhen Jia Zheng, Singapore (SG); Kelvin Ong, Singapore (SG); Tian Hao Gu, Singapore (SG); Syn Kean Cheah, Singapore (SG)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 0 days.

(21) Appl. No.: 10/359,975

(22) Filed: Feb. 7, 2003

(65) Prior Publication Data

US 2004/0155269 A1 Aug. 12, 2004

(51) Int. Cl.⁷ .......................................... H01L 21/4763
(52) U.S. Cl. ...................... 438/622; 438/299; 438/303; 438/595; 438/618; 438/637
(58) Field of Search ................................. 438/299–307, 438/585, 587–588, 595–596, 618, 622, 637–640, 672–675, 685–688

(56) References Cited

U.S. PATENT DOCUMENTS

| | | | |
|---|---|---|---|
| 5,783,475 A | | 7/1998 | Ramaswami ................ 438/303 |
| 6,235,598 B1 | * | 5/2001 | Jan et al. ..................... 438/303 |
| 6,287,951 B1 | * | 9/2001 | Lucas et al. ................ 438/618 |
| 6,432,784 B1 | * | 8/2002 | Yu ............................. 438/303 |
| 2003/0027414 A1 | * | 2/2003 | Ko ............................. 438/595 |
| 2003/0129804 A1 | * | 7/2003 | Mehrotra et al. ........... 438/303 |
| 2003/0181028 A1 | * | 9/2003 | Yeap et al. ................ 438/595 |

* cited by examiner

Primary Examiner—Thanh Nguyen
(74) Attorney, Agent, or Firm—Mikio Ishimaru

(57) ABSTRACT

An integrated circuit, and manufacturing method therefor, is provided. A gate dielectric and a gate are provided respectively on and over a semiconductor substrate. A junction is formed adjacent the gate dielectric and a shaped spacer is formed around the gate. A spacer is formed under the shaped spacer and a liner is formed under the spacer. A first dielectric layer is formed over the semiconductor substrate, the shaped spacer, the spacer, the liner, and the gate. A second dielectric layer is formed over the first dielectric layer. A local interconnect opening is formed in the second dielectric layer down to the first dielectric layer. The local interconnect opening in the first dielectric layer is opened to expose the junction in the semiconductor substrate and the first gate. The local interconnect openings in the first and second dielectric layers are filled with a conductive material.

10 Claims, 4 Drawing Sheets

```
                ┌─────────────────────────────────────────────┐
 200            │  FORMING A FIRST LINER UNDER THE FIRST SPACER│
    ↙           │  OVER THE SEMICONDUCTOR SUBSTRATE  210      │
                └─────────────────────────────────────────────┘
                                     │
                ┌─────────────────────────────────────────────┐
                │  FORMING A FIRST DIELECTRIC LAYER OVER THE  │
                │  SEMICONDUCTOR SUBSTRATE AND THE FIRST GATE │
                │                    212                      │
                └─────────────────────────────────────────────┘
                                     │
                ┌─────────────────────────────────────────────┐
                │  FORMING A SECOND DIELECTRIC LAYER OVER THE │
                │      FIRST DIELECTRIC LAYER  214            │
                └─────────────────────────────────────────────┘
                                     │
                ┌─────────────────────────────────────────────┐
                │  FORMING A LOCAL INTERCONNECT OPENING IN THE│
                │  SECOND DIELECTRIC LAYER TO THE FIRST DIELECTRIC│
                │                  LAYER  216                 │
                └─────────────────────────────────────────────┘
                                     │
                ┌─────────────────────────────────────────────┐
                │  OPENING A LOCAL INTERCONNECT OPENING IN THE│
                │  FIRST DIELECTRIC LAYER EXPOSING THE FIRST GATE│
                │   AND THE JUNCTION IN THE SEMICONDUCTOR     │
                │              SUBSTRATE  218                 │
                └─────────────────────────────────────────────┘
                                     │
                ┌─────────────────────────────────────────────┐
                │  DEPOSITING A CONDUCTIVE MATERIAL IN THE LOCAL│
                │       INTERCONNECT OPENINGS  220            │
                └─────────────────────────────────────────────┘
```

FIG. 6B

METHOD OF MANUFACTURING SEMICONDUCTOR LOCAL INTERCONNECT AND CONTACT

BACKGROUND

1. Technical Field

The present invention relates generally to integrated circuits, and more specifically to local interconnects and isolated contacts for interconnecting semiconductor devices.

2. Background Art

As semiconductor technology continues to evolve, a continuing trend is towards ultra large-scale integration with the fabrication of smaller and smaller integrated circuits with more and faster semiconductor devices.

Fabrication of an integrated circuit involves numerous processing steps. After doped regions have been deposited to form source/drain junctions within a semiconductor substrate and gates have been defined on the substrate, dielectric layers are deposited on the semiconductor devices and conductors are routed over the dielectric layers to connect to and fill openings formed through the dielectric layer to the source/drain junctions and gates. The entire process of routing and making connections is generally termed "metalization". The term derives its origins from interconnect technology, where metals were the first conductors used, but encompasses both metals and conductive materials such as polysilicon. As the complexity of integrated circuit is increased, the complexity of metalization has also increased.

At the same time that the complexity of metallization has increased, multiple layers of interconnect structures have been have come into use as well as short distance interconnects at levels at or below the customary metallization layers. The latter are termed "local interconnects" and are a special form of interconnects for very short distances, such as between the gate and drain of an individual semiconductor device.

A commonly used technique for forming local interconnects is the damascene process. This process involves depositing a dielectric layer over the semiconductor device and then polishing the dielectric layer to make the layer planar. The layer is then patterned and etched to form openings down to the underlying gate or source/drain junctions. A conductor is then deposited in the openings and a chemical-mechanical polishing process (CMP) is used to damascene a conductor into dielectric layer to form the local interconnects and isolated contacts.

There are a number of problems with existing processes such as those caused by larger openings etching at a different rate than smaller openings. This means that the larger local interconnect contacts which have larger openings than the isolated contacts will be completed before the isolated contact openings are open to the source/drain junctions. This is especially true for very small isolated contact openings between very tightly spaced gates (especially at $0.18\mu$ or lower).

Further, the process window for time for etching openings becomes very short when trying to create the different sized isolated contacts and local interconnects. This is especially true at $0.16\mu$ or lower, where the local interconnects are three to four times larger than the isolated contacts. In these cases, the processes often result in gouging of the shallow trench isolations, which separate the semiconductor devices, and loss of isolating spacers.

Also, incomplete filling results in a void area, also known as a "keyhole," that is formed within the metalization. This keyhole is detrimental because it can open up during further processing steps, where material which could corrode or corrupt the tungsten layer can make its way into the keyhole. Also, the void in the center of the conducting metalization layer in the contact causes an increase in contact resistance.

Solutions to problems of this sort have been long sought, but there has been no teaching or suggestion in the prior art how those having ordinary skill in the art could solve these problems.

DISCLOSURE OF THE INVENTION

The present invention provides for a method of manufacturing an integrated circuit with a semiconductor substrate having a first gate dielectric and a first gate provided thereon and thereover. A lightly doped drain is formed in the semiconductor substrate adjacent the gate dielectric, and a spacer liner is formed on the substrate around the first gate dielectric and the first gate. A first spacer is formed on the spacer liner and around the first gate. A second spacer is formed on the first spacer and around the first gate. A first dielectric layer is formed over the semiconductor substrate, the spacer liner, the first and second spacers, and the first gate. A second dielectric layer is formed over the first dielectric layer. A local interconnect opening is formed in the second dielectric layer down to the first dielectric layer. The local interconnect opening in the first dielectric layer is opened to expose the junction in the semiconductor substrate and the first gate. The local interconnect openings in the first and second dielectric layers are filled with a conductive material. The method prevents gouging of the shallow trench isolations and loss of isolating spacers while preventing the formation of keyholes.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

Figure 1:
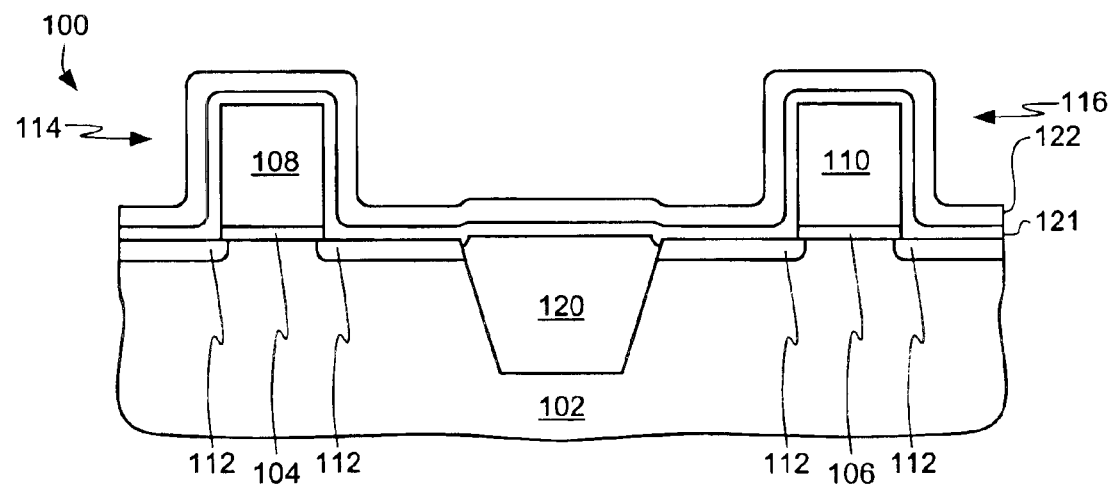
FIG. 1 is a view of an integrated circuit in an intermediate stage of manufacture in accordance with the present invention.

Referring now to FIG. 1, therein is shown an integrated circuit 100 in an intermediate stage of manufacture. The integrated circuit 100 includes a semiconductor substrate 102 having first and second gate dielectrics 104 and 106 formed on the surface of the semiconductor substrate 102 under first and second semiconductor gates 108 and 110, respectively.

The term "horizontal" as used in herein is defined as a plane parallel to the conventional plane or surface of a wafer or substrate, regardless of its orientation. The term "vertical" refers to a direction perpendicular to the horizontal as just defined. Terms, such as "on", "above", "below", "side" (as in "sidewall"), "higher", "lower", "over", and "under", are defined with respect to the horizontal plane. The term "processing" as used herein includes deposition of material or photoresist, patterning, exposure, development, etching, cleaning, and/or removal of the material or photoresist as required in forming a described structure.

The first and second semiconductor gates 108 and 110 have been used to implant lightly doped source/drain junctions 112 in the semiconductor substrate 102. The lightly doped source/drain junctions 112 of different semiconductor devices, such as the first and second semiconductor devices 114 and 116, are separated by shallow trench isolations, such as a shallow trench isolation 120.

A spacer liner layer 121 is deposited over the semiconductor substrate 102, the first and second semiconductor gates 108 and 110, and the shallow trench isolation 120. A first spacer layer 122 is deposited over the spacer liner layer 121.

Figure 2:
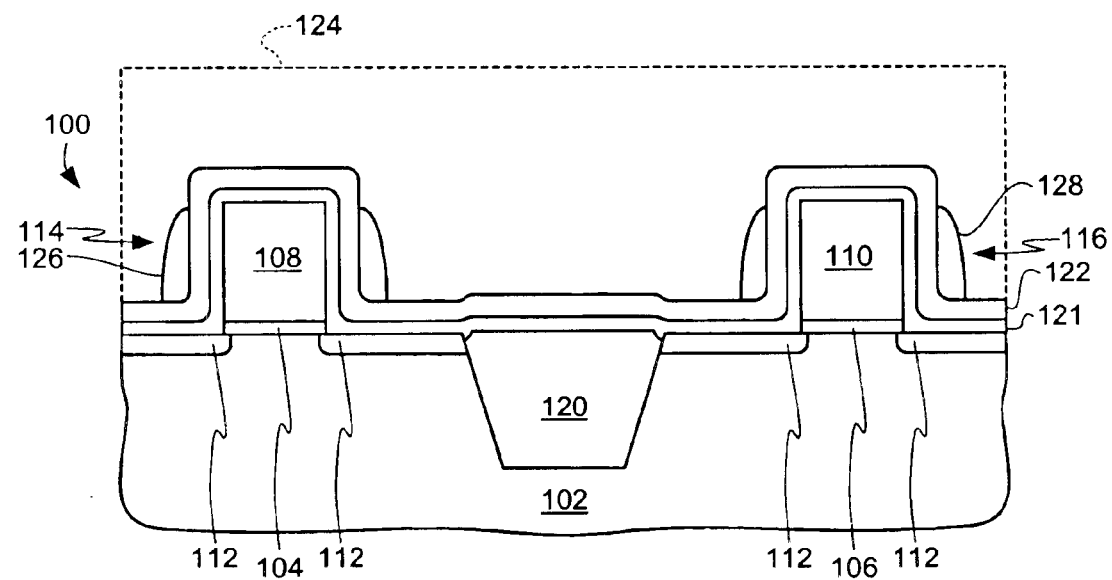
FIG. 2 is the structure of FIG. 1 after further processing.

Referring now to FIG. 2, therein is shown the structure of FIG. 1 after further processing. A second spacer layer 124, shown by dotted lines, has been deposited, and then isotropically etched to form first and second shaped spacers 126 and 128 respectively around the first and second semiconductor gates 108 and 110.

Figure 3:
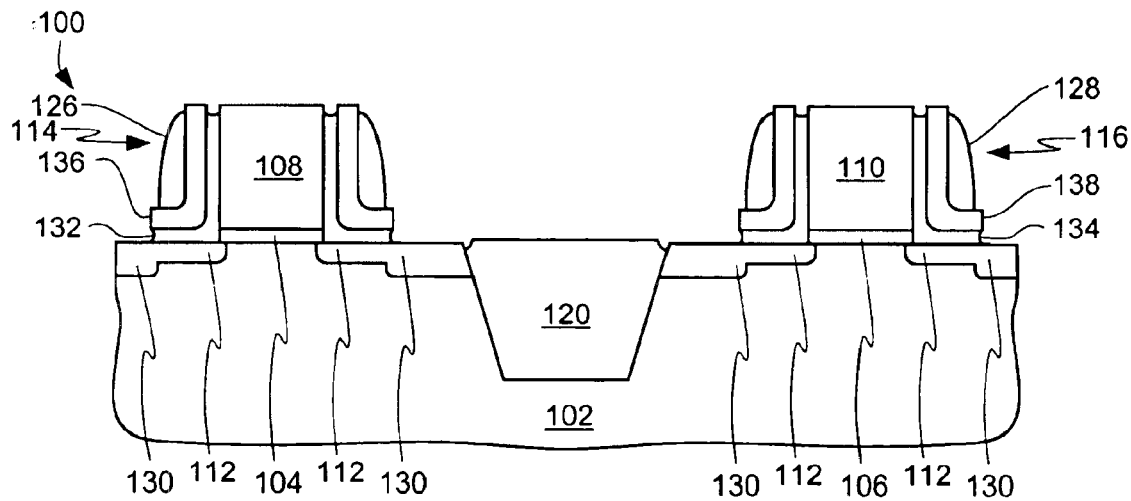
FIG. 3 is the structure of FIG. 2 after further etching.

Referring now to FIG. 3, therein is shown the structure of FIG. 2 after further etching. Isotropic etches have been used to expose the semiconductor substrate 102, the shallow trench isolation 120, and the tops of the first and second semiconductor gates 108 and 110. These etching steps forms the spacer liner layer 121 of FIG. 2 into first and second L-shaped liners 132 and 134 and the first spacer layer 122 of FIG. 2 into first and second L-shaped spacers 136 and 138 respectively around the first and second semiconductor gates 108 and 110. The selectivity of the etch will be such that the first and second L-shaped spacers 136 and 138 will substantially protect the first and second L-shaped liners 132 and 134 during the etching of the spacer liner layer 121 of FIG. 2.

The first and second shaped spacers 126 and 128, the first and second L-shaped liners 132 and 134, and the first and second L-shaped spacers 136 and 138 are used along with the first and second semiconductor gates 108 and 110 during the implantation of deep source/drain junctions 130. The deep source/drain junctions 130 may also be salicided to provide better electrical contact.

Figure 4:
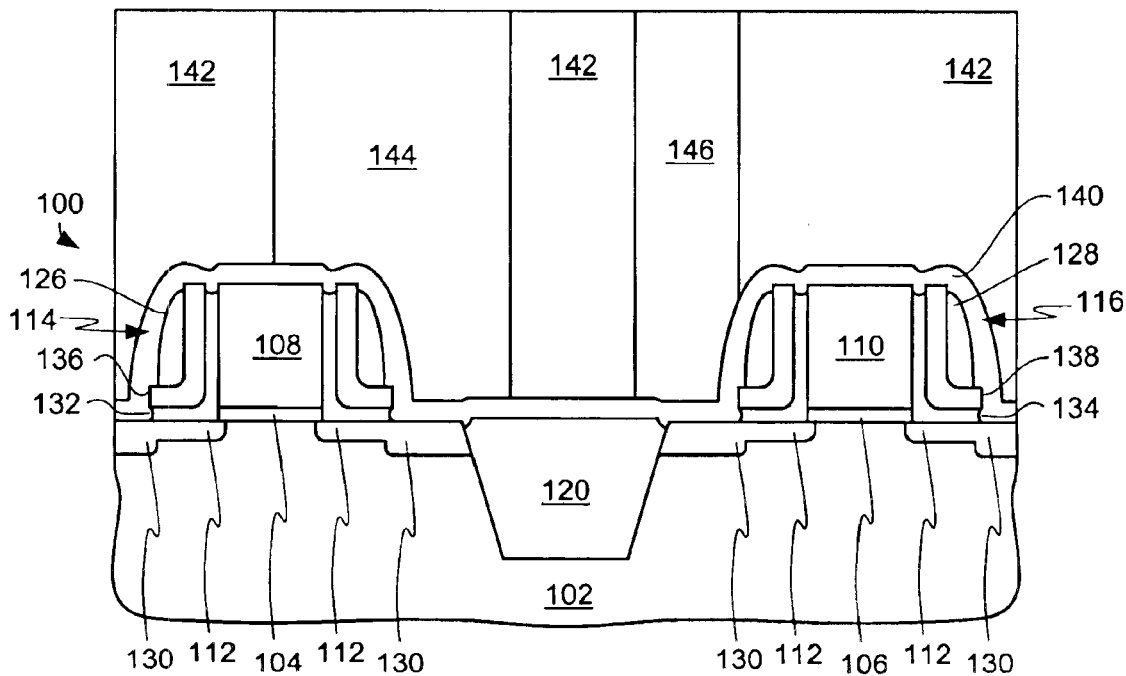
FIG. 4 is the structure of FIG. 3 after deposition and processing of two interlayer dielectric layers.

Referring now to FIG. 4, therein is shown the structure of FIG. 3 after deposition and processing of two interlayer dielectric layers. A first interlayer dielectric layer 140 is deposited over the semiconductor substrate 102, the shallow trench isolation 120, the first and second shaped spacers 126 and 128, the first and second L-shaped liners 132 and 134, the first and second L-shaped spacers 136 and 138, and the first and second semiconductor gates 108 and 110.

A second interlayer dielectric layer 142 is deposited over the first interlayer dielectric layer 140. An anisotropic etching process has been performed into the second interlayer dielectric layer 142 to form a local interconnect opening 144 and a isolated contact opening 146. The two openings are of different sizes but the etch selectivity is such that both openings end at the first interlayer dielectric layer 140; i.e., etching essentially stops at the first interlayer dielectric layer 140 even though the etch may be applied for a substantially long length of time. This compensates for the different etch rates due to the different sizes of the local interconnect opening 144 and the isolated contact opening 146, and provides a very long process window.

Figure 5:
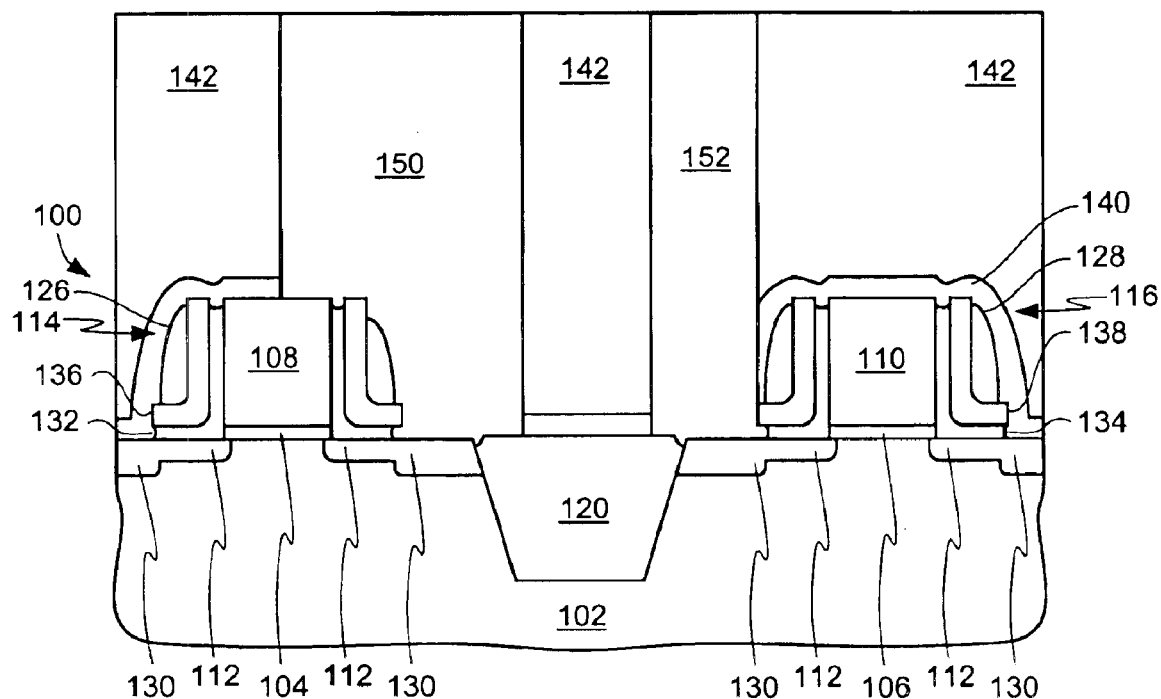
FIG. 5 is the structure of FIG. 4 after further processing.

Referring now to FIG. 5, therein is shown the structure of FIG. 4 after further processing. An etching process has been applied to the local interconnect opening 144 of FIG. 4 and the isolated contact opening 146 of FIG. 4 to remove the first interlayer dielectric layer 140 in the openings. The etching step exposes the top of the first semiconductor gate 108, the semiconductor substrate 102 over the deep source/drain junctions 130 on both sides of the shallow trench isolation 120, and the shallow trench isolation 120.

It will be noted that the first and second L-shaped liners 132 and 134 are slightly etched away under the first and second L-shaped spacers 136 and 138, respectively, but are substantially protected thereby. The first L-shaped spacer 136 is exposed to the etching in the local interconnect opening 144 of FIG. 4, and is slightly etched away but remains substantially intact.

The present invention has a number of advantages. The first shaped spacer 126 prevents punch-through of the first L-shaped spacer 136 and the first L-shaped liner 132. There is also no, or lower, probability of junction spiking during local interconnect formation. This is becoming more important as the technology advances because all the junctions become shallower and shallower, and it is necessary not to etch into the substrate, which contains the lightly doped source/drains junctions.

It will also be understood that in certain devices, the local area interconnect is required; for example, to reduce the SRAM per bit area. In these devices, the protection of the first shaped spacer 126 is required for lower current consumption by reducing junction leakage.

After the etching, the local interconnect opening 144 of FIG. 4 and the isolated contact opening 146 of FIG. 4 are filled with conductor material to form a local interconnect 150 and an isolated contact 152.

Based on the disclosure above it would be evident to those having ordinary skill in the art that different materials may be used provided that they have the proper selectivity to the etch being used in the various steps. For example, in one embodiment, the spacer liner layer 121 of FIG. 1 can be a silicon oxide and the first spacer layer 122 of FIG. 1 can be silicon nitride. If a salicide stop layer is required, the salicide stop layer can be silicon oxide and the spacer liner layer 121 will be silicon nitride. The other materials would be adjusted accordingly.

The first and second shaped spacers 126 and 128 of FIG. 2 can be of silicon oxide and the first interlayer dielectric layer 140 of FIG. 4 can be silicon nitride or silicon oxynitride. The second interlayer dielectric layer 142 can be of silicon oxide, or a low-dielectric constant dielectric material.

The conductive material for the local interconnect 150 and the isolated contact 152 can be of a conductive material such as tungsten (W), tantalum (Ta), titanium (Ti), alloys thereof, and compounds thereof or conductive materials such as copper (Cu), aluminum (Al), alloys thereof, and compounds thereof with appropriate barrier layers.

Figure 6A:
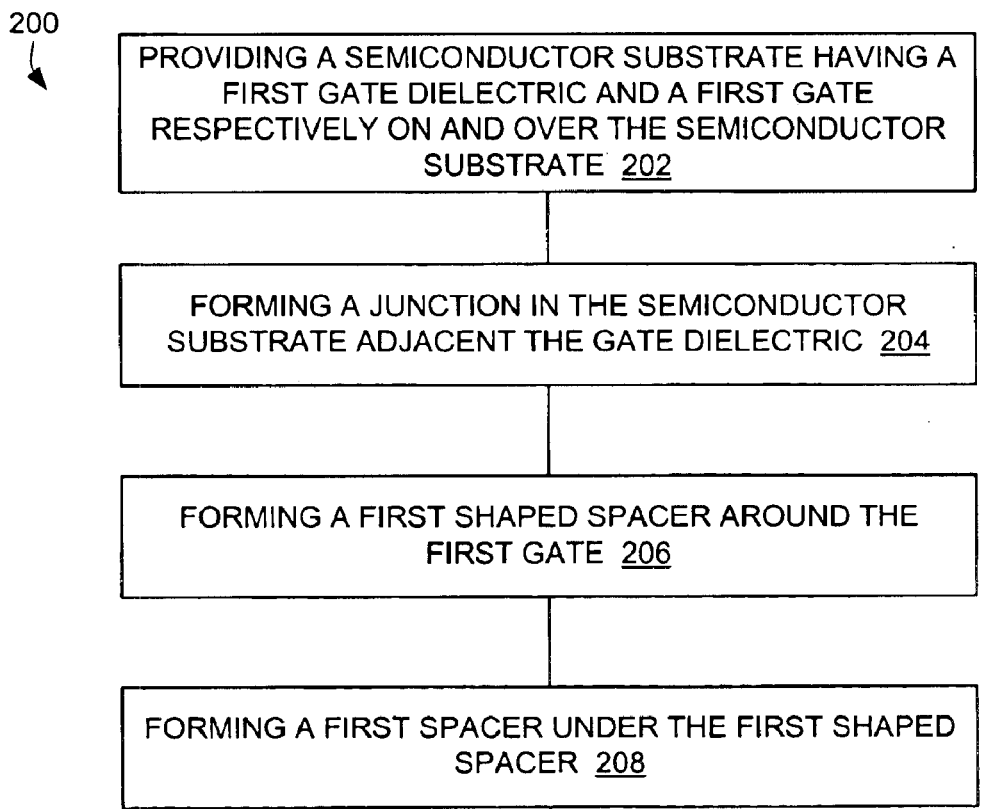
FIG. 6 is a simplified flow chart of the method of manufacturing an integrated circuit in accordance with the present invention.

Referring now to FIGS. 6A and 6B, therein is shown a simplified flow chart of a method 200 in accordance with the present invention. The method 200 includes:

a step 202 of providing a semiconductor substrate having a first gate dielectric and a first gate respectively on and over the semiconductor substrate;

a step 204 of forming a junction in the semiconductor substrate adjacent the gate dielectric;

a step 206 of forming a first shaped spacer around the first gate;

a step 208 of forming a first spacer under the first shaped spacer;

a step 210 of forming a first liner under the first spacer over the semiconductor substrate;

a step 212 of forming a first dielectric layer over the semiconductor substrate and the first gate;

a step 214 of forming a second dielectric layer over the first dielectric layer;

a step 216 of forming a local interconnect opening in the second dielectric layer to the first dielectric layer;

a step 218 of opening a local interconnect opening in the first dielectric layer exposing the first gate and the junction in the semiconductor substrate; and a step 220 of depositing a conductive material in the local interconnect openings.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters hithertofore set forth herein or shown in the accompanying drawings are to be interpreted in an illustrative and non-limiting sense.

The invention claimed is:

1. A method for manufacturing an integrated circuit comprising:

providing a semiconductor substrate having a first gate dielectric and a first gate respectively on and over the semiconductor substrate;

forming a junction in the semiconductor substrate adjacent the first gate dielectric;

forming a first shaped spacer around the first gate;

forming a first spacer under the first shaped spacer;

forming a first liner under the first spacer over the semiconductor substrate;

forming a first dielectric layer over the semiconductor substrate and the first gate;

forming a second dielectric layer over the first dielectric layer;

forming a local interconnect opening in the second dielectric layer to the first dielectric layer;

opening a local interconnect opening in the first dielectric layer exposing the first gate and the junction in the semiconductor substrate; and depositing a conductive material in the local interconnect openings.

2. The method as claimed in claim 1 wherein forming the first liner and forming the first spacer use different materials having high etch selectivity between the different materials.

3. The method as claimed in claim 1 wherein forming the first spacer and forming the first shaped spacer use different materials having high etch selectivity between the different materials.

4. The method as claimed in claim 1 wherein forming the first dielectric layer and forming the second dielectric layer use different materials having high etch selectivity between the different materials.

5. The method as claimed in claim 1 wherein:

providing the semiconductor substrate provides a second gate dielectric and a second gate respectively on and over the semiconductor substrate;

forming the junction forms the junction in the semiconductor substrate adjacent the second gate dielectric;

forming the first shaped spacer forms a second shaped spacer around the second gate;

forming the first spacer forms a second spacer under the first shaped spacer;

forming the first liner forms a second liner under the second spacer over the semiconductor substrate;

forming the local interconnect opening forms an isolated contact opening in the second dielectric layer to the first dielectric layer;

opening the local interconnect opening opens the isolated contact opening in the first dielectric layer exposing the junction in the semiconductor substrate adjacent the second gate dielectric; and depositing the conductive material deposits the conductive material in the isolated contact opening in the second dielectric layer and the isolated contact opening in the first dielectric layer.

6. A method for manufacturing an integrated circuit comprising:

providing a semiconductor substrate having a first gate dielectric and a first gate respectively on and over the semiconductor substrate;

forming a source/drain junction in the semiconductor substrate adjacent the gate dielectric;

depositing a liner layer over the semiconductor substrate and on the first gate;

depositing a spacer layer over the liner layer;

depositing a shaped spacer layer over the spacer layer;

forming a first shaped spacer from the shaped spacer layer on the spacer layer;

forming a first L-shaped spacer from the spacer layer on the liner layer around the first gate;

forming a first L-shaped liner around the first gate from the liner layer;

forming a first dielectric layer over the semiconductor substrate, the first L-shaped liner, the first L-shaped spacer, the first shaped spacer, and the first gate;

forming a second dielectric layer over the first dielectric layer;

forming a local interconnect opening in the second dielectric layer down to the first dielectric layer;

opening a local interconnect opening in the first dielectric layer exposing the first gate and the source/drain junction in the semiconductor substrate; and depositing a conductive material in the local interconnect opening in the second dielectric layer and in the local interconnect opening in the first dielectric layer.

7. The method as claimed in claim 6 wherein depositing the liner layer and depositing the spacer layer deposits different materials having high etch selectivity between the different materials.

8. The method as claimed in claim 6 wherein depositing the spacer layer and depositing the shaped spacer layer deposits different materials having high etch selectivity between the different materials.

9. The method as claimed in claim 6 wherein depositing the first dielectric layer and depositing the second dielectric layer deposits different materials having high etch selectivity between the different materials.

10. The method as claimed in claim 6 wherein:

providing the semiconductor substrate provides a second gate dielectric and a second gate respectively on and over the semiconductor substrate;

forming the source/drain junction forms the source/drain junction in the semiconductor substrate adjacent the second gate dielectric;

forming the first shaped spacer forms a second shaped spacer on the spacer layer from the shaped spacer layer;

forming the first L-shaped spacer forms a second L-shaped spacer on the liner layer from the spacer layer around the first gate;

forming the first L-shaped liner forms a second L-shaped liner from the liner layer around the first gate;

forming the local interconnect opening forms an isolated contact opening in the second dielectric layer to the first dielectric layer;

opening the local interconnect opening opens the isolated contact opening in the first dielectric layer exposing the source/drain junction in the semiconductor substrate adjacent the second gate dielectric; and depositing the conductive material deposits the conductive material in the isolated contact opening in the second dielectric layer and the isolated contact opening in the first dielectric layer.

* * * * *